(12) United States Patent
Ahn et al.

(10) Patent No.: US 12,356,874 B2
(45) Date of Patent: Jul. 8, 2025

(54) SEMICONDUCTOR DEVICE AND METHOD OF MANUFACTURING SEMICONDUCTOR DEVICE

(71) Applicant: SK hynix Inc., Icheon (KR)

(72) Inventors: Jun Ku Ahn, Icheon (KR); Gwang Sun Jung, Icheon (KR); Jong Ho Lee, Icheon (KR); Uk Hwang, Icheon (KR)

(73) Assignee: SK hynix Inc., Icheon-si (KR)

( * ) Notice: Subject to any disclaimer, the term of this patent is extended or adjusted under 35 U.S.C. 154(b) by 872 days.

(21) Appl. No.: 17/382,057

(22) Filed: Jul. 21, 2021

(65) Prior Publication Data
US 2022/0254997 A1    Aug. 11, 2022

(30) Foreign Application Priority Data
Feb. 5, 2021 (KR) .................. 10-2021-0017026

(51) Int. Cl.
*H10N 70/00* (2023.01)
*H10B 63/00* (2023.01)

(52) U.S. Cl.
CPC .......... *H10N 70/826* (2023.02); *H10B 63/80* (2023.02); *H10N 70/063* (2023.02); *H10N 70/066* (2023.02); *H10N 70/841* (2023.02)

(58) Field of Classification Search
CPC .................................................. H10N 70/826
See application file for complete search history.

(56) References Cited

U.S. PATENT DOCUMENTS

| | | | |
|---|---|---|---|
| 7,833,824 B2 | 11/2010 | Lee | |
| 10,249,683 B1* | 4/2019 | Lille | H10N 70/231 |
| 10,312,437 B2 | 6/2019 | Liu | |
| 11,342,379 B2* | 5/2022 | Sung | H10B 63/80 |
| 2018/0205017 A1* | 7/2018 | Bruce | H10B 63/84 |
| 2020/0135807 A1* | 4/2020 | Brew | G11C 13/0011 |
| 2020/0365799 A1* | 11/2020 | Lee | H10N 70/231 |

FOREIGN PATENT DOCUMENTS

| | | |
|---|---|---|
| JP | 2010-153868 A | 7/2010 |
| JP | 2020-515046 A | 5/2020 |

* cited by examiner

*Primary Examiner* — Mounir S Amer

(57) ABSTRACT

A semiconductor device may include a first electrode, a second electrode, an insulating layer interposed between the first electrode and the second electrode and including an opening having an inclined sidewall, a variable resistance layer formed in the opening, and a liner interposed between the variable resistance layer and the insulating layer and between the variable resistance layer and the first electrode. The variable resistance layer includes a first surface and a second surface, the first surface facing the first electrode and having a first area, the second surface facing the second electrode and having a second area different from the first area. The variable resistance layer maintains an amorphous state during a program operation.

16 Claims, 13 Drawing Sheets

SEMICONDUCTOR DEVICE AND METHOD OF MANUFACTURING SEMICONDUCTOR DEVICE

CROSS-REFERENCE TO RELATED APPLICATION

The present application claims priority under 35 U.S.C. § 119(a) to Korean patent application number 10-2021-0017026 filed on Feb. 5, 2021, in the Korean Intellectual Property Office, the entire disclosure of which is incorporated by reference herein.

BACKGROUND

1. Field of Invention

The present disclosure relates to an electronic device, and more particularly, to a semiconductor device and a method of manufacturing the semiconductor device.

2. Description of Related Art

An integration degree of a semiconductor device is mainly determined by an area occupied by a unit memory cell. Recently, as an integration degree of a semiconductor device forming a memory cell in a single layer on a substrate reaches a limit, a three-dimensional semiconductor device in which memory cells are stacked on a substrate is being proposed. In addition, in order to improve operation reliability of the semiconductor device, various structures and manufacturing methods are being developed.

SUMMARY

An embodiment of the present disclosure provides a semiconductor device having a stable structure and an improved characteristic, and a method of manufacturing the semiconductor device.

According to an embodiment of the present disclosure, a semiconductor device may include a first electrode, a second electrode, an insulating layer interposed between the first electrode and the second electrode and including an opening having an inclined sidewall, a variable resistance layer formed in the opening, the variable resistance layer including a first surface and a second surface, the first surface facing the first electrode and having a first area, the second surface facing the second electrode and having a second area different from the first area, the variable resistance layer maintaining an amorphous state during a program operation, and a liner interposed between the variable resistance layer and the insulating layer and between the variable resistance layer and the first electrode.

According to an embodiment of the present disclosure, a semiconductor device may include a first electrode, a second electrode, a first insulating layer interposed between the first electrode and the second electrode and including a first opening having a first inclined sidewall, a second insulating layer interposed between the first insulating layer and the second electrode and including a second opening having a second inclined sidewall, a variable resistance layer including a first portion formed in the first opening and a second portion formed in the second opening, the first portion having a first sidewall slope, the second portion having a second sidewall slope different from the first sidewall slope, the variable resistance layer maintaining an amorphous state during a program operation, and a liner interposed between the variable resistance layer and the first and second insulating layers.

According to an embodiment of the present disclosure, a method of manufacturing a semiconductor device may include forming a first electrode, forming an insulating layer on the first electrode, forming an opening that passes through the insulating layer and has an inclined sidewall, forming a liner on the sidewall and a lower surface of the opening, forming a variable resistance layer in the opening in which the liner is formed, and forming a second electrode on the variable resistance layer, wherein the variable resistance layer includes a first surface and a second surface, the first surface facing the first electrode and having a first area, the second surface facing the second electrode and having a second area different from the first area, the variable resistance layer maintains an amorphous state during a program operation.

According to an embodiment of the present disclosure, a method of manufacturing a semiconductor device may include forming a first electrode, forming a first insulating layer on the first electrode, forming a second insulating layer on the first insulating layer, the second insulating layer having an etching rate different from that of the first insulating layer, forming a second opening that passes through the second insulating layer and has a second inclined sidewall, forming a first opening that passes through the first insulating layer and has a first inclined sidewall, forming a liner in the first opening and the second opening, forming a variable resistance layer including a first portion formed in the first opening and a second portion formed in the second opening, the first portion having a first sidewall slope, the second portion having a second sidewall slope different from the first sidewall slope, the variable resistance layer maintaining an amorphous state during a program operation, and forming a second electrode on the variable resistance layer.

An integration degree of a semiconductor device may be improved. In addition, a semiconductor device having a stable structure and improved reliability may be provided.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms should not be construed as being limited to the embodiments described in the present specification or application.

Figure 1A:
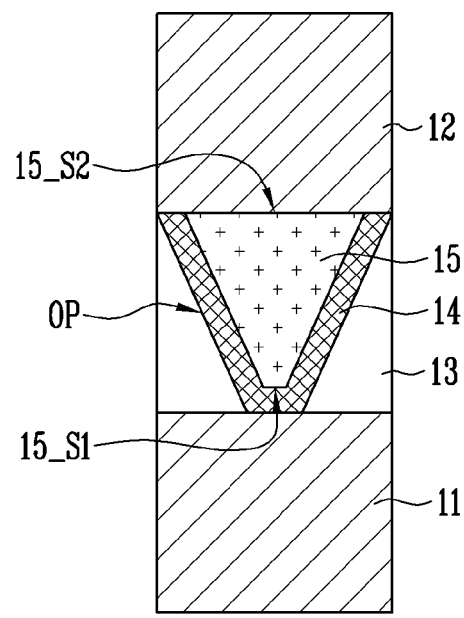
FIGS. 1A and 1B are diagrams illustrating a structure of a semiconductor device according to an embodiment of the present disclosure.
Figure 1B:
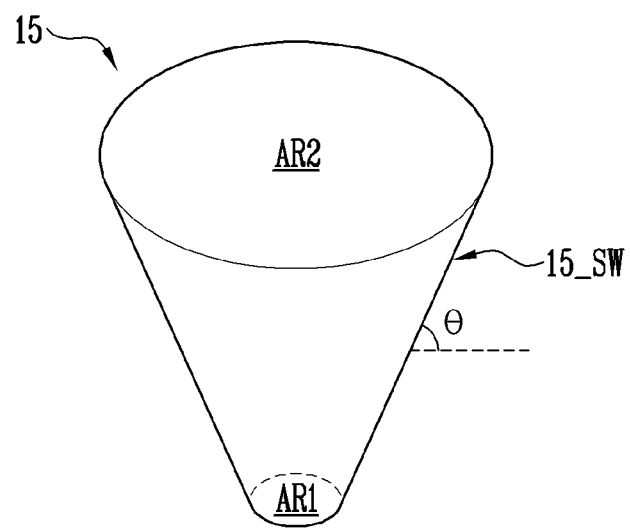

FIGS. 1A and 1B are diagrams each illustrating a structure of a semiconductor device according to an embodiment of the present disclosure.

Referring to FIGS. 1A and 1B, the semiconductor device may include a first electrode 11, a second electrode 12, an insulating layer 13, a liner 14, and a variable resistance layer 15. The first electrode 11 may be a portion of a word line or a bit line, or may be electrically connected to the word line or the bit line. The first electrode 11 may include a conductive material such as polysilicon or metal. As an embodiment, the first electrodes 11 may include polysilicon, tungsten (W), tungsten nitride (WNx), tungsten silicide (WSix), titanium (Ti), titanium nitride (TiNx), titanium silicon nitride (TiSiN), titanium aluminum nitride (TiAlN), tantalum (Ta), tantalum nitride (TaN), tantalum silicon nitride (TaSiN), tantalum aluminum nitride (TaAlN), carbon (C), silicon carbide (SiC), silicon carbon nitride (SiCN), copper (Cu), zinc (Zn), nickel (Ni), cobalt (Co), lead (Pd), platinum (Pt), molybdenum (Mo), ruthenium (Ru), or the like, and may include a combination thereof.

The second electrode 12 may be a portion of a bit line or a word line, or may be electrically connected to the bit line or the word line. For example, when the first electrode 11 is electrically connected to the word line, the second electrode 12 may be electrically connected to the bit line. The second electrode 12 may include a conductive material such as polysilicon or metal. As an embodiment, the second electrodes 12 may include polysilicon, tungsten (W), tungsten nitride (WNx), tungsten silicide (WSix), titanium (Ti), titanium nitride (TiNx), titanium silicon nitride (TiSiN), titanium aluminum nitride (TiAlN), tantalum (Ta), tantalum nitride (TaN), tantalum silicon nitride (TaSiN), tantalum aluminum nitride (TaAlN), carbon (C), silicon carbide (SiC), silicon carbon nitride (SiCN), copper (Cu), zinc (Zn), nickel (Ni), cobalt (Co), lead (Pd), platinum (Pt), molybdenum (Mo), ruthenium (Ru), or the like, and may include a combination thereof.

The insulating layer 13 may be interposed between the first electrode 11 and the second electrode 12. The insulating layer 13 may include an opening OP passing through the insulating layer 13 from the first electrode 11 to the second electrode 12. The opening OP may have a hole shape, and may have a plane of a circle, an ellipse, a polygon, or the like. A cross section of the opening OP may have an asymmetric structure. The opening OP may have an inclined sidewall. As an embodiment, a width of the opening OP that is in contact with the first electrode 11 may be different from a width of the opening OP that is in contact with the second electrode 12. For example, the width of the opening OP that is in contact with the second electrode 12 may be greater than the width of the opening OP that is in contact with the first electrode 11.

The insulating layer 13 may insulate the first electrode 11 and the second electrode 12 from each other. The insulating layer 13 may include an insulating material such as oxide, silicon oxide, nitride, and silicon nitride. The insulating layer 13 may be a single layer or multiple layers.

The liner 14 may be interposed between the variable resistance layer 15 and the insulating layer 13 and between the variable resistance layer 15 and the first electrode 11. As an embodiment, the liner 14 may be interposed between the variable resistance layer 15 and the insulating layer 13, and may extend between the variable resistance layer 15 and the first electrode 11. The liner 14 may have a cup shape surrounding a lower surface of the variable resistance layer 15. A cross section of the liner 14 may have a U or V shape.

The liner 14 may have a substantially uniform thickness or may have different thicknesses according to a portion. As an embodiment, the liner 14 may have a substantially uniform thickness at the lower surface and the sidewall of the opening OP. For example, when the liner 14 includes a first portion wrapping a sidewall 15_SW of the variable resistance layer 15 and a second portion extending from a lower surface of the variable resistance layer 15 to an upper surface of the first electrode 11, the liner 14 may have a first thickness of the first portion in a first direction (e.g., the horizontal direction of FIG. 1A) and have a second thickness of the second portion in a second direction (e.g., the vertical direction of FIG. 1A) such that a difference between the first thickness and the second thickness being equal to or less than 1%, 3%, or 5% of a given value (e.g., an average of the first and second thicknesses). As an embodiment, the liner 14 may be thicker at the lower surface of the opening OP than on the sidewall. As an embodiment, the liner 14 may have a substantially uniform thickness at the lower surface of the opening OP and may have different thicknesses at corresponding portions of the sidewall. The liner 14 may have a thickness of 1 to 20 Å between the variable resistance layer 15 and the first electrode 11. The liner 14 may include nitride or silicon nitride.

The variable resistance layer 15 may be formed in the opening OP. A cross section of the variable resistance layer 15 may have an asymmetric structure. The variable resistance layer 15 may have a sidewall 15_SW, and the sidewall 15_SW may have a slope of a predetermined angle θ. The slope of the sidewall 15_SW may be substantially uniform or partially different.

The variable resistance layer 15 may include a first surface 15_S1 facing the first electrode 11 and a second surface 15_S2 facing the second electrode 12. According to the slope of the sidewall 15_SW, the area of the first surface 15_S1 and the area of the second surface 15_S2 may be different. As an embodiment, the area of the second surface 15_S2 may be greater than the area of the first surface 15_S1.

The first surface 15_S1 may contact the liner 14, and the second surface 15_S2 may contact the second electrode 12. Therefore, the area of the first surface 15_S1 may be a first contact area AR1 between the variable resistance layer 15 and the liner 14, and the area of the second surface 15_S2 may be a second contact area AR2 between the variable resistance layer 15 and the second electrode 12.

Due to the asymmetric structure of the variable resistance layer 15, the first contact area AR1 may be different from the second contact area AR2. In addition, a difference between the first contact area AR1 and the second contact area AR2 may increase or decrease according to the slope of the sidewall 15_SW. When the slope of the sidewall 15_SW is relatively large, the difference between the first contact area AR1 and the second contact area AR2 may be relatively small. When the slope of the sidewall 15_SW is relatively small, the difference between the first contact area AR1 and the second contact area AR2 may be relatively large. Therefore, the difference between the first contact area AR1 and the second contact area AR2 may be adjusted by adjusting the slope of the sidewall 15_SW.

The variable resistance layer 15 may include a resistive material, and may have a characteristic of reversibly transiting between different resistance states according to an applied voltage or current.

As an embodiment, the variable resistance layer 15 may include a transition metal oxide or a metal oxide such as a perovskite material. Therefore, data may be stored in a memory cell by generating or extinguishing an electrical path in the variable resistance layer 15.

As an embodiment, the variable resistance layer 15 may have an MTJ (Magnetic Tunnel Junction) structure, and may include a magnetization pinned layer, a magnetization free layer, and a tunnel barrier layer interposed therebetween. For example, the magnetization pinned layer and the magnetization free layer may include a magnetic material, and the tunnel barrier layer may include an oxide such as magnesium (Mg), aluminum (Al), zinc (Zn), and titanium (Ti). Here, a magnetization direction of the magnetization free layer may be changed by spin torque of electrons in the applied current. Therefore, data may be stored in the memory cell according to a change of the magnetization direction of the magnetization free layer with respect to the magnetization direction of the magnetization pinned layer.

As an embodiment, the variable resistance layer 15 may include a phase change material and may include chalcogenide. The variable resistance layer 15 may include chalcogenide glass, chalcogenide alloy, or the like. The variable resistance layer 15 may include silicon (Si), germanium (Ge), antimony (Sb), tellurium (Te), bismuth (Bi), indium (In), tin (Sn), selenium (Se), or the like, and may include a combination thereof. As an embodiment, the variable resistance layer 15 may be Ge—Sb—Te (GST), and may be $Ge_2Sb_2Te_5$, $Ge_2Sb_2Te_7$, $Ge_1Sb_2Te_4$, $Ge_1Sb_4Te_7$, or the like. The variable resistance layer 15 may change a phase according to a program operation. As an embodiment, the variable resistance layer 15 may have a low resistance crystalline state through a set operation. As an embodiment, the variable resistance layer 15 may have a high resistance amorphous state by a reset operation. Therefore, data may be stored in the memory cell by using a resistance difference according to the phase of the variable resistance layer 15.

As an embodiment, the variable resistance layer 15 may include a variable resistance material in which a resistance is changed without a phase change, and may include a chalcogenide material. The variable resistance layer 15 may include germanium (Ge), antimony (Sb), tellurium (Te), arsenic (As), selenium (Se), silicon (Si), indium (In), tin (Sn), sulfur (S), gallium (Ga), or the like, or may include a combination thereof. The variable resistance layer 15 may include chalcogenide maintaining an amorphous state. The variable resistance layer 15 may have the amorphous state, and may not be changed to a crystalline state during a program operation. Therefore, a threshold voltage of the memory cell may be changed according to a program voltage applied to the memory cell, and the memory cell may be programmed to at least two states. As an embodiment, when a negative program voltage is applied to the memory cell, the variable resistance layer 15 may have a high resistance amorphous state, and the memory cell may have a relatively high threshold voltage. As an embodiment, when a positive program voltage is applied to the memory cell, the variable resistance layer 15 may have a low resistance amorphous state, and the memory cell may have a relatively low threshold voltage. Therefore, data may be stored in the memory cell by using a threshold voltage difference of the memory cell.

According to the structure as described above, the first electrode 11, the second electrode 12, the liner 14, and the variable resistance layer 15 may configure the memory cell. During the program operation, a current may flow through the liner 14, and data may be stored in the memory cell by performing the program operation.

In addition, the variable resistance layer 15 may have an asymmetric structure due to the inclined sidewall. Therefore, during the program operation, a current path may be formed locally in the liner 14 and the variable resistance layer 15. Accordingly, a change width of the threshold voltage may be increased, and a read window margin may be secured. For example, a change width of the threshold voltage may correspond to a difference between a relatively high threshold voltage and a relatively low threshold voltage respectively associated with a high resistance amorphous state and a low resistance amorphous state, and the change width may be increased in a memory cell including the variable resistance layer 15 and the liner 14 according to an embodiment of the present disclosure compared to a conventional memory cell.

For reference, in the embodiment shown in FIGS. 1A and 1B, a case where the variable resistance layer 15 has the asymmetric structure is described, but the first electrode 11 or the second electrode 12 may also have an asymmetric structure. In such a case, a memory cell in which the contact area of the first electrode 11 and the variable resistance layer 15 and the contact area of the second electrode 12 and the variable resistance layer 15 are different from each other may be implemented, by adjusting the shape or the sidewall slope of the first electrode 11 or the second electrode 12.

Figure 2A:
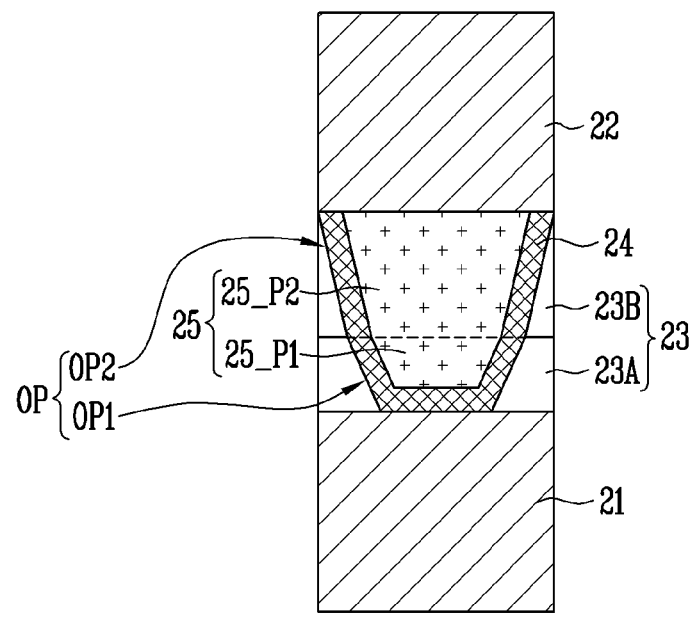
FIGS. 2A and 2B are diagrams illustrating a structure of a semiconductor device according to an embodiment of the present disclosure.
Figure 2B:
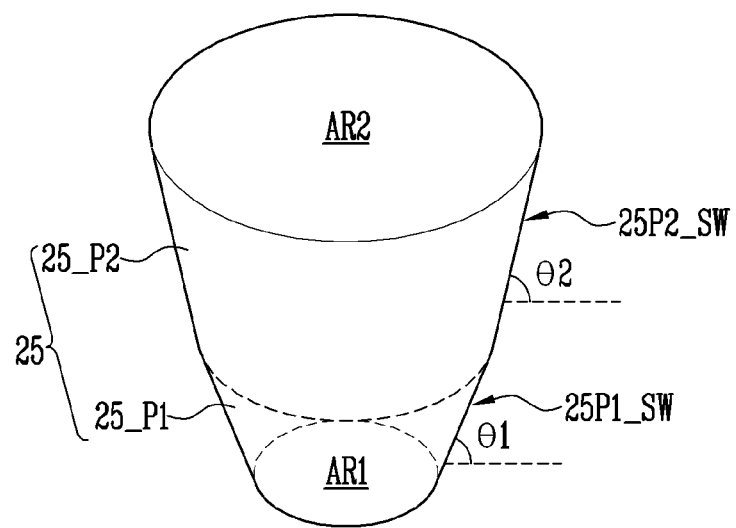

FIGS. 2A and 2B are diagrams each illustrating a structure of a semiconductor device according to an embodiment of the present disclosure. Hereinafter, the content repetitive to the previously described content may be omitted for the interest of brevity.

Referring to FIGS. 2A and 2B, the semiconductor device may include a first electrode 21, a second electrode 22, an insulating layer 23, a liner 24, and a variable resistance layer 25. The insulating layer 23 may include a first insulating layer 23A and a second insulating layer 23B. The first insulating layer 23A may be interposed between the first electrode 21 and the second electrode 22. The second insulating layer 23B may be interposed between the first insulating layer 23A and the second electrode 22. The first insulating layer 23A and the second insulating layer 23B may include materials having different etching rates. As an embodiment, the first insulating layer 23A may include nitride, silicon nitride, or the like, and the second insulating layer 23B may include oxide, silicon oxide, or the like.

The opening OP may include a first opening OP1 passing through the first insulating layer 23A and a second opening OP2 passing through the second insulating layer 23B. A first sidewall (e.g., a first inclined sidewall) of the first opening OP1 and a second sidewall of (e.g., a second inclined sidewall) the second opening OP2 may have substantially the same slope or different slopes. A sidewall slope of the first opening OP1 may be adjusted according to the etching rate of the first insulating layer 23A, and a sidewall slope of the second opening OP2 may be adjusted according to the etching rate of the second insulating layer 23B. In an embodiment, the sidewall slope of the second opening OP2 may be greater than that of the first opening OP1.

The liner 24 may be positioned in the opening OP, and the variable resistance layer 25 may be positioned in the liner 24. The variable resistance layer 25 may include a first portion 25_P1 formed in the first opening OP1 and a second portion 25_P2 formed in the second opening OP2. The first portion 25_P1 may have a first sidewall 25P1_SW with a first sidewall slope (e.g., a first angle θ1), and the second portion 25_P2 may have a second sidewall 25P2_SW with a second sidewall slope (e.g., a second angle θ2). The first angle θ1 and the second angle θ2 may be substantially the same or different. As an embodiment, the second sidewall slope of the second sidewall 25P2_SW may be greater than the first sidewall slope of the first sidewall 25P1_SW.

According to the structure as described above, the slope of the first sidewall 25P1_SW may correspond to the sidewall slope of the first opening OP1, and the slope of the second sidewall 25P2_SW may correspond to the sidewall slope of the second opening OP2. Therefore, the sidewall slope of the variable resistance layer 25 may be adjusted according to a configuration of the insulating layer 23. The sidewall slope of the variable resistance layer 25 may be partially adjusted according to an etching rate of multiple layers included in the insulating layer 23.

Figure 3A:
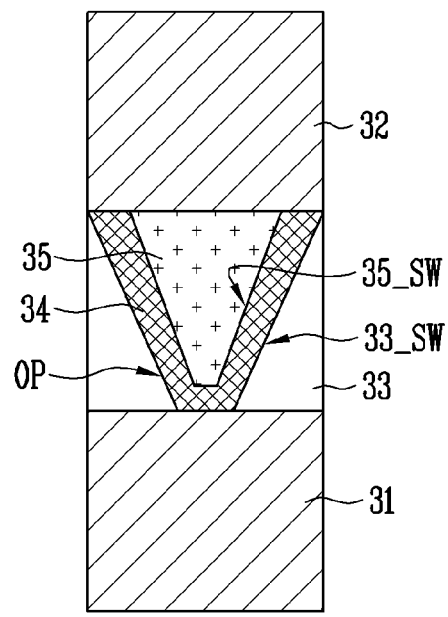
FIGS. 3A and 3B are diagrams illustrating a structure of a semiconductor device according to an embodiment of the present disclosure.
Figure 3B:
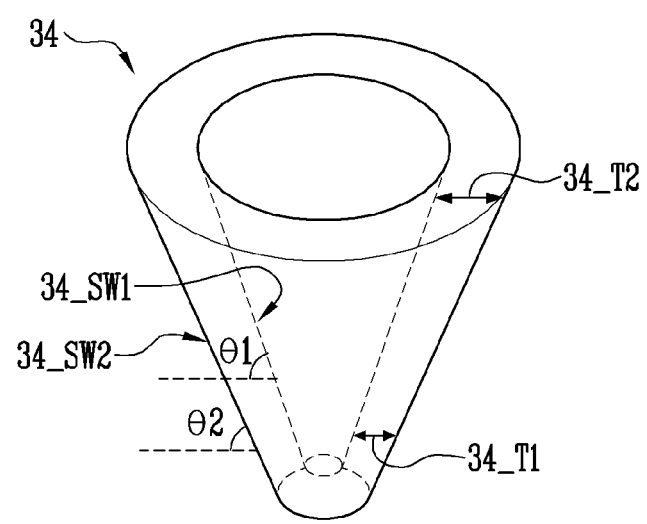

FIGS. 3A and 3B are diagrams each illustrating a structure of a semiconductor device according to an embodiment of the present disclosure. Hereinafter, the content repetitive to the previously described content may be omitted for the interest of brevity.

Referring to FIGS. 3A and 3B, the semiconductor device may include a first electrode 31, a second electrode 32, an insulating layer 33, a liner 34, and a variable resistance layer 35. The liner 34 may be positioned in the insulating layer 33, and the variable resistance layer 35 may be positioned in the liner 34. The liner 34 may have a plurality of portions having different thicknesses. A first thickness 34_T1 of a first portion of the liner 34 adjacent to the first electrode 31 and a second thickness 34_T2 of a second portion of the liner 34 adjacent to the second electrode 32 may be different. As an embodiment, the second thickness 34_T2 may be thicker than the first thickness 34_T1.

The liner 34 may include a first sidewall 34_SW1 that is in contact with the variable resistance layer 35 and a second sidewall 34_SW2 that is in contact with the insulating layer 33. The first sidewall 34_SW1 may have a slope of a first angle θ1, and the second sidewall 34_SW2 may have a slope of a second angle θ2. The first sidewall 34_SW1 and the second sidewall 34_SW2 may have different slopes. As an embodiment, the first angle θ1 may be greater than the second angle θ2.

A sidewall of the variable resistance layer 35 may have a slope corresponding to the first sidewall 34_SW1, and a sidewall 33_SW of the insulating layer 33 may have a slope corresponding to the second sidewall 34_SW2. Therefore, the slope of the sidewall 33_SW of the insulating layer 33 may be different from the slope of the sidewall 35_SW of the variable resistance layer 35. The slope of the sidewall 35_SW of the variable resistance layer 35 may be greater than the slope of the sidewall 33_SW of the insulating layer 33.

According to the structure as described above, the slope of the sidewall 35_SW of the variable resistance layer 35 may be adjusted according to the thickness of the liner 34. Therefore, the contact area of the variable resistance layer 35 and the liner 34 and the contact area of the variable resistance layer 35 and the second electrode 32 may be adjusted, by adjusting the thickness of the liner 34.

Figure 4:
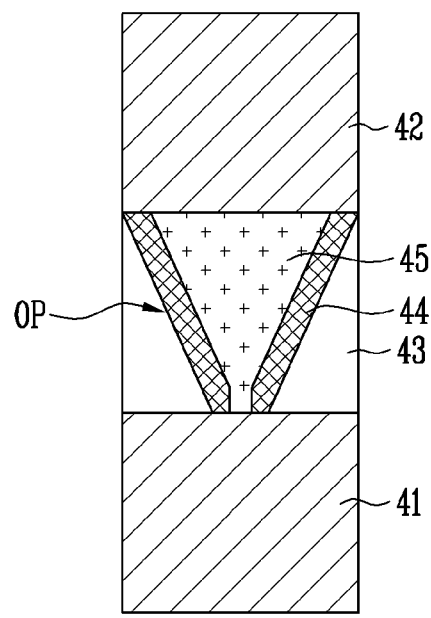
FIG. 4 is a diagram illustrating a structure of a semiconductor device according to an embodiment of the present disclosure.

FIG. 4 is a diagram illustrating a structure of a semiconductor device according to an embodiment of the present disclosure. Hereinafter, the content repetitive to the previously described content may be omitted for the interest of brevity.

Referring to FIG. 4, the semiconductor device may include a first electrode 41, a second electrode 42, an insulating layer 43, a liner pattern 44, and a variable resistance layer 45. The liner pattern 44 may be formed to surround a sidewall of the variable resistance layer 45, and the variable resistance layer 45 may pass through the liner pattern 44 and contact the first electrode 41.

The variable resistance layer 45 may have an asymmetric structure due to an inclined sidewall. The insulating layer 43 may be formed of a single layer or may be formed of multilayered layers having different etching rates. The liner pattern 44 may have a substantially uniform thickness or may have a partially different thickness.

FIGS. 5A, 5B, 5C, and 5D are diagrams illustrating a method of manufacturing a semiconductor device according to an embodiment of the present disclosure. Hereinafter, the content repetitive to the previously described content may be omitted for the interest of brevity.

Figure 5A:
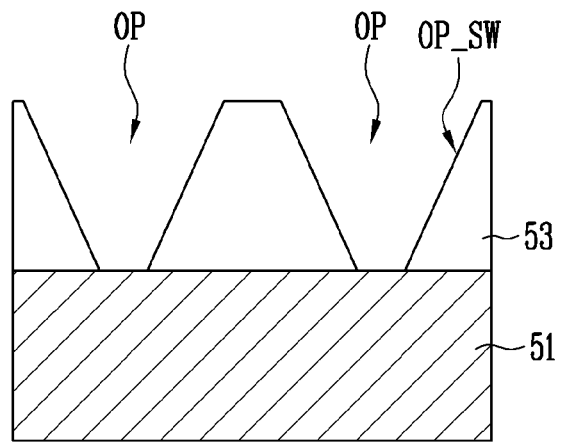
FIGS. 5A, 5B, 5C, and 5D are diagrams illustrating a method of manufacturing a semiconductor device according to an embodiment of the present disclosure.

Referring to FIG. 5A, a first electrode 51 is formed. As an embodiment, a plurality of first electrodes 51 each extending in parallel in a specific direction may be formed. Gap fill layers (not shown) may be filled between the first electrodes 51. The gap fill layers may include an insulating material such as oxide, nitride, and an air gap.

Subsequently, an insulating layer 53 is formed on the first electrode 51. Subsequently, openings OP passing through the insulating layer 53 are formed. The insulating layer 53 may be etched so that each of the openings OP has an inclined sidewall OP_SW. Each of the openings OP may expose the first electrode 51.

Figure 5B:
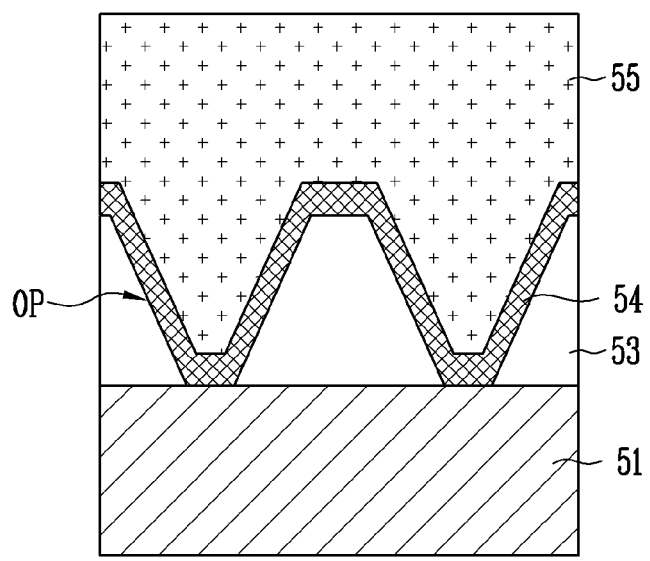

Referring to FIG. 5B, a liner layer 54 is formed. The liner layer 54 may be formed on the sidewall and a lower surface of the openings OP, and may be further formed on an upper surface of the insulating layer 53. As an embodiment, the liner layer 54 may be deposited along an inner surface of the openings OP and the upper surface of the insulating layer 53.

The liner layer 54 may be formed to have a substantially uniform thickness. Alternatively, the liner layer 54 may be formed to have a partially different thickness. As an embodiment, the liner layer 54 may be formed to have a substantially uniform thickness on a surface of the first electrode 51 exposed through the openings OP. The liner layer 54 may be formed to have a greater thickness on the surface of the first electrode 51 than a thickness on a sidewall of the insulating layer 53. On the sidewall of the insulating layer 53, the liner layer 54 may be formed to have a substantially uniform thickness or increase the thickness toward an upper portion. The liner layer 54 may be formed to have a substantially uniform thickness on the upper surface of the insulating layer 53. The liner layer 54 may be formed to have a thickness on the upper surface of the insulating layer 53 greater than a thickness on the sidewall of the insulating layer 53. The liner layer 54 may be formed to have a thickness of 1 to 20 Å on the lower surface of the openings OP. For example, the liner layer 54 may be formed to have a thickness of 1 to 20 Å on the lower surface of the openings OP, which corresponds to the exposed surface of the first electrode 51 of FIG. 5A, in the vertical direction of FIG. 5B.

Subsequently, a variable resistance material layer 55 is formed. The variable resistance material layer 55 may be deposited on the liner layer 54. Through this, the variable resistance material layer 55 may be formed to fill an inside of the openings OP in which the liner layer 54 is formed. The variable resistance material layer 55 may also be formed on the upper surface of the insulating layer 53.

Figure 5C:
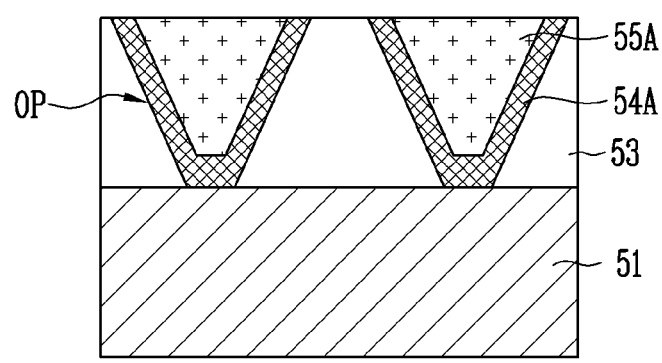

Referring to FIG. 5C, variable resistance layers 55A are formed. As an embodiment, the variable resistance layers 55A may be formed by flattening the variable resistance material layer 55 until a surface of the insulating layer 53 or the liner layer 54 is exposed. The variable resistance material layer 55 may be flattened by a chemical mechanical polishing (CMP) method. As an embodiment, the variable resistance layers 55A may be formed by etching the variable resistance material layer 55 in an etch back method. When forming the variable resistance layers 55A, the liner layer 54 may also be flattened or etched, and liners 54A may be formed. The liners 54A formed in each opening OP may be separated from each other. In such a case, the liners 54A of neighboring memory cells may be separated from each other. Alternatively, the liner layer 54 may remain on the upper surface of the insulating layer 53. In such a case, neighboring memory cells may share the liner layer 54.

The variable resistance layers 55A may be positioned in the openings OP, respectively, and may be separated from each other. Each of the variable resistance layers 55A may have an inclined sidewall. A sidewall slope of the variable resistance layers 55A may reflect a sidewall slope of the insulating layer 53 or a sidewall slope of the liner 54A.

Figure 5D:
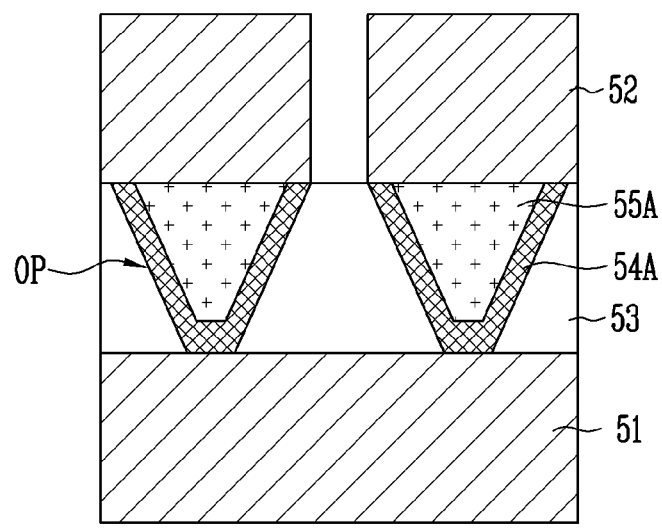

Referring to FIG. 5D, second electrodes 52 are formed on the variable resistance layers 55A. The second electrodes 52 may extend in parallel in a direction crossing the first electrodes 51.

According to the manufacturing method as described above with reference to FIGS. 5A to 5D, the variable resistance layers 55A having the inclined sidewall may be formed by using the sidewall slope of the insulating layer 53. In addition, memory cells each including the variable resistance layers 55A having the inclined sidewall may be formed. Each of the variable resistance layers 55A may include a first surface facing the first electrode 51 and a second surface facing the second electrode 52. The area of the second surface may be different from the area of the first surface. The area of the second surface may be greater than the area of the first surface. The variable resistance layers 55A may maintain an amorphous state during a program operation.

FIGS. 6A, 6B, 6C, and 6D are diagrams illustrating a method of manufacturing a semiconductor device according to an embodiment of the present disclosure. Hereinafter, the content repetitive to the previously described content may be omitted for the interest of brevity.

Figure 6A:
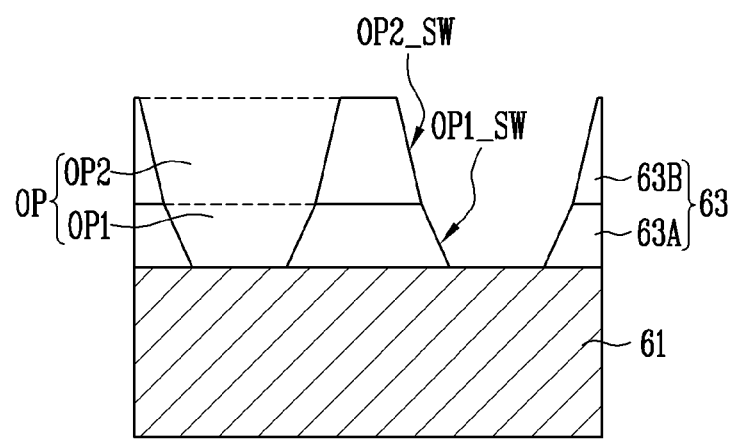
FIGS. 6A, 6B, 6C, and 6D are diagrams illustrating a method of manufacturing a semiconductor device according to an embodiment of the present disclosure.

Referring to FIG. 6A, a first electrode 61 is formed. Subsequently, an insulating layer 63 is formed on the first electrode 61. The insulating layer 63 may have a multilayer structure. As an embodiment, after forming a first insulating layer 63A on the first electrode 61, a second insulating layer 63B is formed on the first insulating layer 63A. The second insulating layer 63B may include a material having an etching rate different from that of the first insulating layer 63A.

Subsequently, an opening OP passing through the insulating layer 63 is formed. As an embodiment, second openings OP2 passing through the second insulating layer 63B and exposing the first insulating layer 63A are formed. Subsequently, first openings OP1 passing through the first insulating layer 63A and exposing the first electrode 61 are formed. Through this, the openings OP each including the first opening OP1 and the second opening OP2 may be formed.

The first opening OP1 may have a first sidewall OP1_SW, and the second opening OP2 may have a second sidewall OP2_SW. The first sidewall OP1_SW and the second sidewall OP2_SW may have different slopes. A slope difference between the first sidewall OP1_SW and the second sidewall OP2_SW may be caused by an etching rate difference between the first insulating layer 63A and the second insulating layer 63B. As an embodiment, the etching rate of the second insulating layer 63B may be greater than that of the first insulating layer 63A, and the slope of the second sidewall OP2_SW may be greater than that of the first sidewall OP1_SW.

Figure 6B:
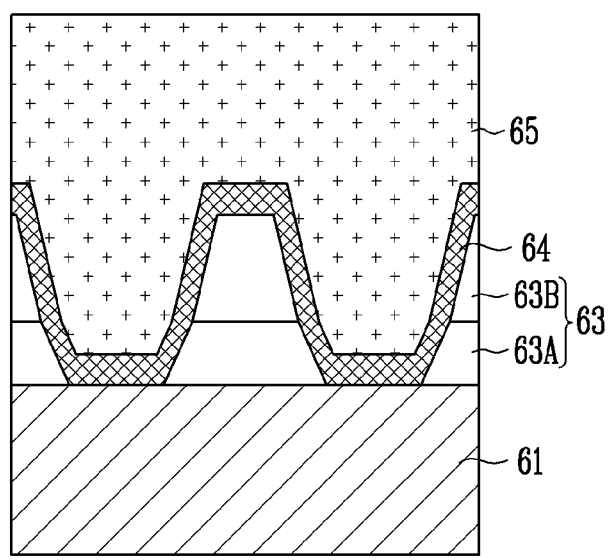

Referring to FIG. 6B, subsequently, a liner layer 64 is formed. The liner layer 64 may be formed on a sidewall and a lower surfaces of the openings OP, and may be further formed on an upper surface of the second insulating layer 63B. As an embodiment, the liner layer 64 may be deposited along an inner surface of the first openings OP1, an inner surface of the second openings OP2, and the upper surface of the second insulating layer 63B. The liner layer 64 may be formed to have a substantially uniform thickness. Alternatively, the liner layer 64 may be formed to have a partially different thickness.

Subsequently, a variable resistance material layer 65 is formed. The variable resistance material layer 65 may be formed in the first openings OP1 and the second openings OP2 in which the liner layer 64 is formed. The variable resistance material layer 65 may also be formed on the upper surface of the second insulating layer 63B.

Figure 6C:
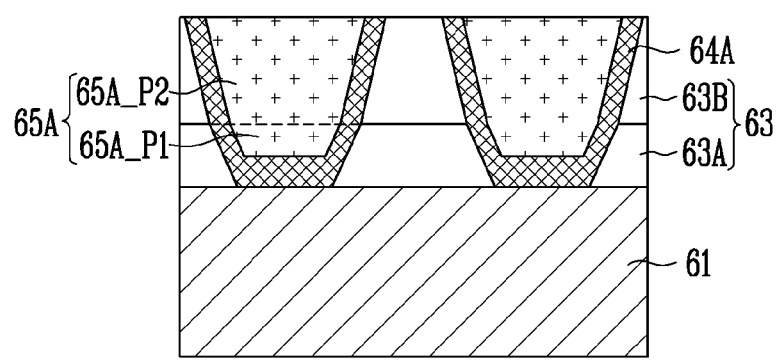

Referring to FIG. 6C, variable resistance layers 65A are formed. The variable resistance layer 65A may be formed by flattening or etching the variable resistance material layer 65. Each of the variable resistance layers 65A may include a first portion 65A_P1 positioned in the first opening OP1 and a second portion 65A_P2 positioned in the second opening OP2. A sidewall of the first portion 65A_P1 and a sidewall of the second portion 65A_P2 may have different slopes. A sidewall slope of the first portion 65A_P1 may reflect a sidewall slope of the first insulating layer 63A. A sidewall slope of the second portion 65A_P2 may reflect a sidewall slope of the second insulating layer 63B. When forming the variable resistance layers 65A, the liner layer 64 may also be flattened or etched, and liners 64A may be formed.

Figure 6D:
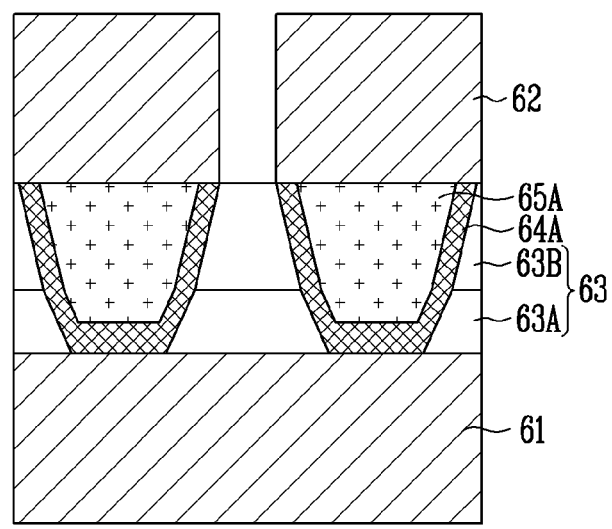

Referring to FIG. 6D, second electrodes 62 are formed on the variable resistance layers 65A.

According to the manufacturing method as described above with reference to FIGS. 6A to 6D, the slope of the variable resistance layers 65A may be partially adjusted by using the etching rate difference between the first insulating layer 63A and the second insulating layer 63B.

FIGS. 7A, 7B, 7C, and 7D are diagrams illustrating a method of manufacturing a semiconductor device according to an embodiment of the present disclosure. Hereinafter, the content repetitive to the previously described content may be omitted for the interest of brevity.

Figure 7A:
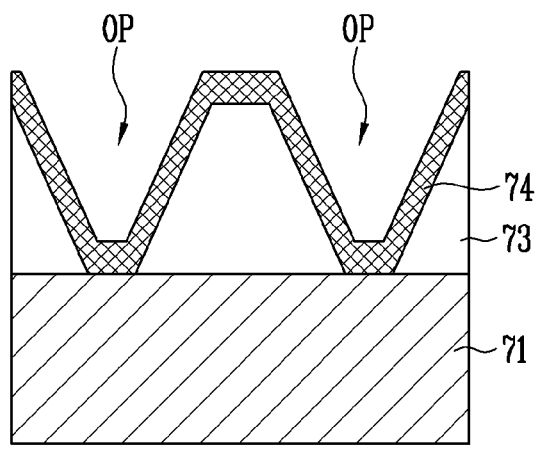
FIGS. 7A, 7B, 7C, and 7D are diagrams illustrating a method of manufacturing a semiconductor device according to an embodiment of the present disclosure.

Referring to FIG. 7A, a first electrode 71 is formed. Subsequently, an insulating layer 73 is formed on the first electrode 71. The insulating layer 73 may have a single layer structure or a multilayer structure. Subsequently, openings OP passing through the insulating layer 73 are formed. Each of the openings OP may have an inclined sidewall. Subsequently, a liner layer 74 is formed. The liner layer 74 may be formed on a sidewall and a lower surface of each of the openings OP, and may be further formed on an upper surface of the insulating layer 73.

Figure 7B:
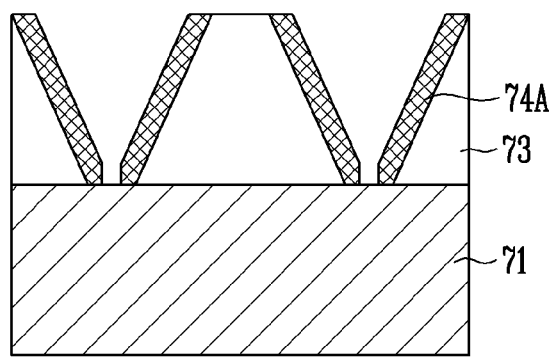

Referring to FIG. 7B, the liner layer 74 is etched. Through this, liners 74A may be formed on the sidewall of the openings OP. Each of the liners 74A may have a substantially uniform thickness or may have a partially different thickness. As an embodiment, the liner layer 74 may be etched using an etch back method. A portion of the liner layer 74 formed on the lower surface of the openings OP may be etched, and the first electrode 71 may be exposed. In addition, a portion of the liner layer 74 formed on the upper surface of the insulating layer 73 may be etched. The upper surface of the insulating layer 73 may be exposed, or the liner layer 74 may partially remain on the upper surface of the insulating layer 73. For reference, some of the liner layer 74 may remain on the lower surface of the openings OP.

Figure 7C:
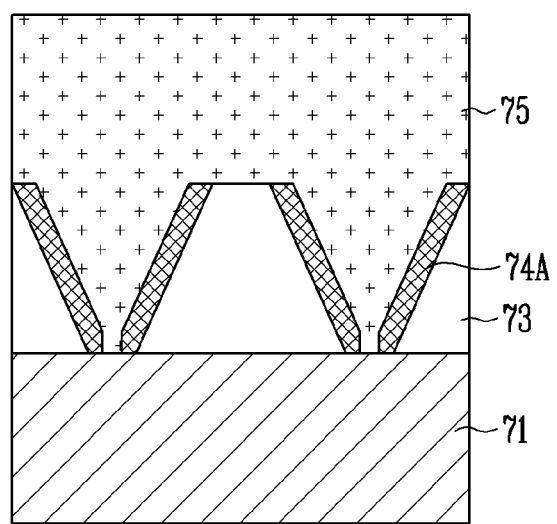

Referring to FIG. 7C, a variable resistance material layer 75 is formed. The variable resistance material layer 75 may be formed in the openings OP in which the liners 74A are formed. The variable resistance material layer 75 may also be formed on the upper surface of the insulating layer 73.

Figure 7D:
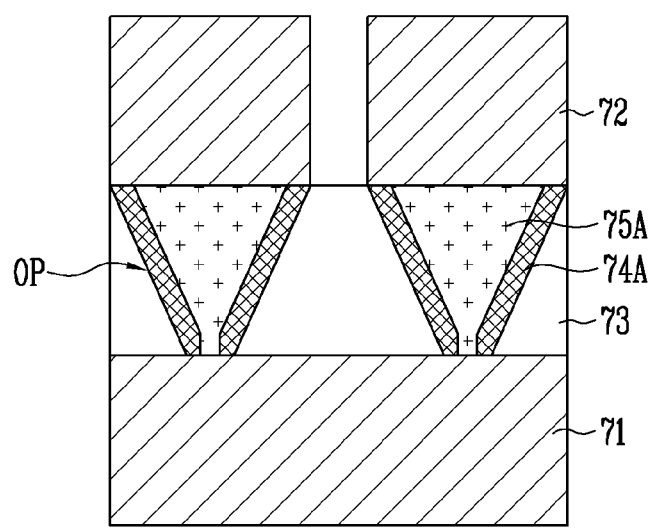

Referring to FIG. 7D, variable resistance layers 75A are formed. The variable resistance layers 75A may be formed by flattening or etching the variable resistive material layer 75. Each of the variable resistance layers 75A may have an inclined sidewall. Subsequently, second electrodes 72 are formed on the variable resistance layers 75A.

According to the manufacturing method as described above with reference to FIGS. 7A to 7D, the variable resistance material layer 75 is formed after the liner layer 74 is etched. A shape or a thickness of the liners 74A may be adjusted by etching the liner layer 74, and thus a sidewall slope of the variable resistance layers 75A may be adjusted.

The memory circuit or the semiconductor device of the above-described embodiments may be used in various devices or systems. FIGS. 8, 9, 10, and 11 illustrate some examples of devices or systems that may implement the memory circuit or the semiconductor device of the above-described embodiments.

Figure 8:
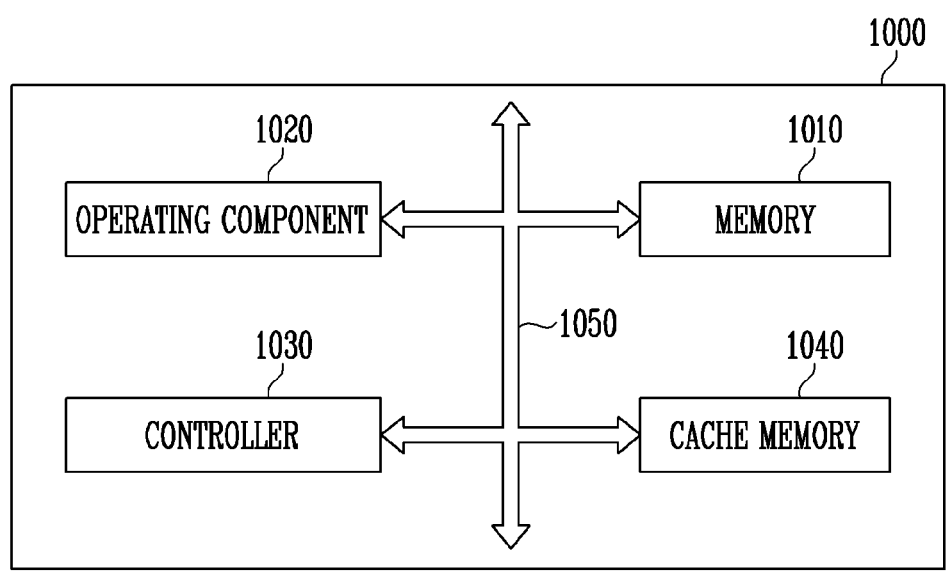
FIG. 8 is one example of a configuration diagram of a microprocessor implementing a memory device according to an embodiment of the present disclosure.

FIG. 8 is one example of a configuration diagram of a microprocessor implementing a memory device according to an embodiment of the present disclosure.

Referring to FIG. 8, the microprocessor 1000 may control and adjust a series of processes of receiving data from various external devices, processing the data, and transmitting a result of the process to the external device, and may include a memory 1010, an operating component 1020, a controller 1030, and the like. The microprocessor 1000 may be various data processing devices such as a central processing unit (CPU), a graphic processing unit (GPU), and a digital signal processor (DSP), an application processor.

The memory 1010 may be a processor register, a register, or the like, may store data in the microprocessor 1000, may include various registers such as a data register, an address register, and a floating point register. The memory 1010 may temporarily store addresses at which data for performing an operation in the operating component 1020, data of a result of the performance, and data for the performance are stored.

The memory 1010 may include one or more embodiments of the semiconductor device described above. For example, the memory 1010 may include one or more memory elements. The memory element may include a first electrode, a second electrode, an insulating layer interposed between the first electrode and the second electrode and including an opening of an inclined sidewall, a variable resistance layer formed in the opening, including a first surface facing the first electrode and having a first area and a second surface facing the second electrode and having a second area different from the first area, and maintaining an amorphous state during a program operation, and a liner interposed between the variable resistance layer and the insulating layer and between the variable resistance layer and the first electrode. Therefore, reliability of the memory 1010 may be improved and a manufacturing process may be improved. As a result, an operation characteristic of the microprocessor 1000 may be improved.

The operating component 1020 may perform various arithmetic operations or logical operations according to a result obtained by decoding an instruction by the controller 1030. The operating component 1020 may include one or more arithmetic and logic units (ALUs) and the like.

The controller 1030 may receive a signal from the memory 1010, the operating component 1020, and an external device of the microprocessor 1000, perform extraction or decoding of an instruction and control of a signal input/output of the microprocessor 1000, and the like, and execute a process indicated by a program.

The microprocessor 1000 according to the present embodiment may further include a cache memory 1040 capable of temporarily storing data input from an external device or data to be output to an external device, in addition to the memory 1010. In this case, the cache memory 1040 may exchange data with the memory 1010, the operating component 1020, and the controller 1030 through a bus interface 1050.

Figure 9:
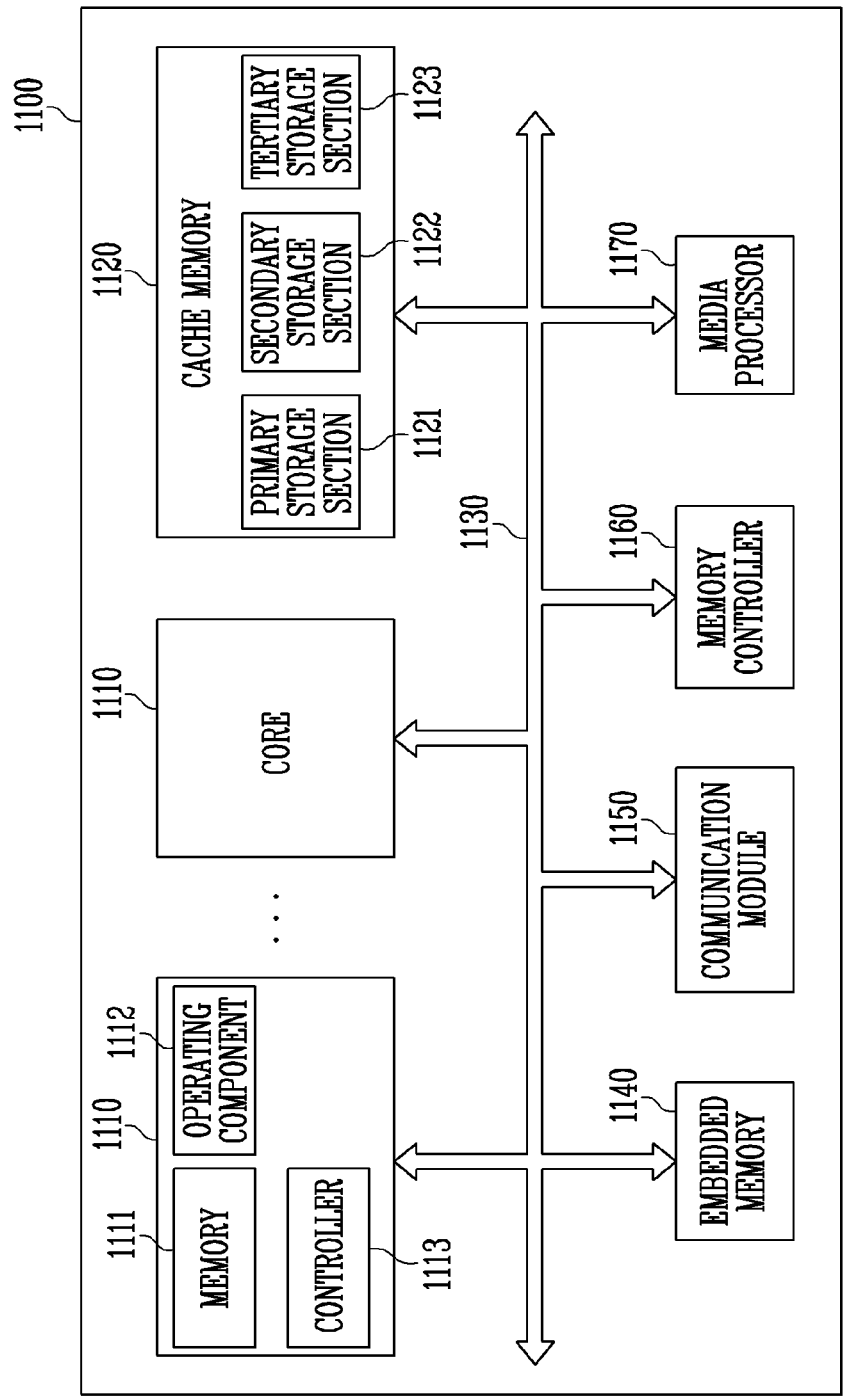
FIG. 9 is one example of a configuration diagram of a processor implementing a memory device according to an embodiment of the present disclosure.

FIG. 9 is one example of a configuration diagram of a processor implementing a memory device according to an embodiment of the present disclosure.

Referring to FIG. 9, the processor 1100 may include various functions in addition to the functions of the microprocessor described above to improve performance and implement multi-function. The processor 1100 may include a core 1110 serving as a microprocessor, a cache memory 1120 temporarily store data, and a bus interface 1130 for transferring data between internal and external devices. The processor 1100 may include various system on chips (SoCs) such as a multi core processor, a graphic processing unit (GPU), and an application processor (AP).

The core 1110 of the present embodiment may be a part for performing an arithmetic logic operation on data input from an external device and may include a memory 1111, an operating component 1112, and a controller 1113. The memory 1111, the operating component 1112, and the controller 1113 may be substantially the same as the memory 1010, the operating component 1020, and the controller 1030 described above.

The cache memory 1120 temporarily stores data to compensate for a data process speed difference between the core 1110 operating at a high speed and an external device operating at a low speed. The cache memory 1120 may include a primary storage section 1121 and a secondary storage section 1122, and may include a tertiary storage section 1123 when a high capacity is required. The cache memory 1120 may include more storage sections as needed. That is, the number of storage sections included in the cache memory 1120 may vary depending on design. Here, process speeds for storing and discriminating data in the primary, secondary, and tertiary storage sections 1121, 1122, and 1123 may be the same or different. When the process speeds of each storage section are different, the speed of the primary storage section 1121 may be the fastest. One or more of the primary storage section 1121, the secondary storage section 1122, and the tertiary storage section 1123 of the cache memory 1120 may include one or more embodiments of the semiconductor device described above. For example, the cache memory 1120 may include one or more embodiments of the semiconductor device described above. For example, the cache memory 1120 may include one or more memory elements. The memory element may include a first electrode, a second electrode, an insulating layer interposed between the first electrode and the second electrode and including an opening of an inclined sidewall, a variable resistance layer formed in the opening, including a first surface facing the first electrode and having a first area and a second surface facing the second electrode and having a second area different from the first area, and maintaining an amorphous state during a program operation, and a liner interposed between the variable resistance layer and the insulating layer and between the variable resistance layer and the first electrode. Therefore, reliability of the cache memory 1120 may be improved and a manufacturing process may be improved. As a result, an operation characteristic of the processor 1100 may be improved.

The present embodiment shows a case where all of the primary, secondary, and tertiary storage sections 1121, 1122, and 1123 are configured in the cache memory 1120. However, some or all of the primary, secondary, and tertiary storage sections 1121, 1122, and 1123 may be configured in an inside of the core 1110 and compensate for the process speed difference between the core 1110 and the external device.

The bus interface 1130 connects the core 1110, the cache memory 1120, and an external device so as to efficiently transmit data.

The processor 1100 according to the present embodiment may include a plurality of cores 1110 and the plurality of cores 1110 may share the cache memory 1120. The plurality of cores 1110 and the cache memory 1120 may be directly connected to each other or may be connected to each other through the bus interface 1130. All of the plurality of cores 1110 may be configured identically to the core described above. A storage section in each of the plurality of cores 1110 may be configured to be shared with a storage section outside the core 1110 through the bus interface 1130.

The processor 1100 according to the present embodiment may include an embedded memory 1140 that stores data, a communication module 1150 that may transmit and receive data in a wired manner or wirelessly with an external device, a memory controller 1160 that drives an external storage device, a media processor 1170 that processes data processed by the processor 1100 and input from an external input device and outputs the processed data to an external interface device, and the like. In addition, the processor 1100 may further include a plurality of modules and devices. In this case, the plurality of added modules may exchange data with the core 1110 and the cache memory 1120 through the bus interface 1130.

Here, the embedded memory 1140 may include a non-volatile memory as well as a volatile memory. The volatile memory may include a dynamic random access memory (DRAM), a mobile DRAM, a static random access memory (SRAM), a memory performing a function similar to that of these, and the like. The non-volatile memory may include a read only memory (ROM), a NOR flash memory, a NAND flash memory, a phase change random access memory (PRAM), a resistive random access memory (RRAM), a spin transfer torque random access memory (STTRAM), a magnetic random access memory (MRAM), a memory performing a function similar to that of these, and the like.

The communication module 1150 may include a module capable of connecting with a wired network, a module capable of connecting with a wireless network, and both of the modules capable of connecting with a wired network and the module capable of connecting with a wireless network. A wired network module may include a local area network (LAN), a universal serial bus (USB), an Ethernet, a power line communication (PLC), or the like, as various devices that transmit and receive data through a transmission line. A wireless network module may include an infrared data association (IrDA), a code division multiple access (CDMA), a time division multiple access (TDMA), a frequency division multiple access (FDMA), a wireless LAN, Zigbee, a ubiquitous sensor network (USN), Bluetooth, radio frequency identification (RFID), long term evolution (LTE), near field communication (NFC), wireless broadband Internet (WIBRO), high speed downlink packet access (HSDPA), wideband CDMA (WCDMA), ultra wide band (UWB), and the like, as various devices that transmit and receive data without a transmission line.

The memory controller 1160 is for processing and managing data transmitted between the processor 1100 and an external storage device operating according to a different communication standard. The memory controller 1160 may include various memory controllers, for example, a controller that controls integrated device electronics (IDE), serial advanced technology attachment (SATA), a small computer system interface (SCSI), redundant array of independent disks (RAID), a solid state disk (SSD), external SATA (eSATA), personal computer memory card international association (PCMCIA), a universal serial bus (USB), a secure digital (SD) card, a mini secure digital (mSD) card, a micro secure digital (micro SD) card, a secure digital high capacity (SDHC) card, a memory stick card, a smart media (SM) card, a multi-media card (MMC), an embedded MMC (eMMC), a compact flash (CF) card, and the like.

The media processor 1170 may process data processed by the processor 1100 and data input as an image, a voice, and other formats from an external input device, and may output the data to an external interface device. The media processor 1170 may include a graphics processing unit (GPU), a digital signal processor (DSP), high-definition audio (HD Audio), high-definition multimedia interface (HDMI) controller, and the like.

Figure 10:
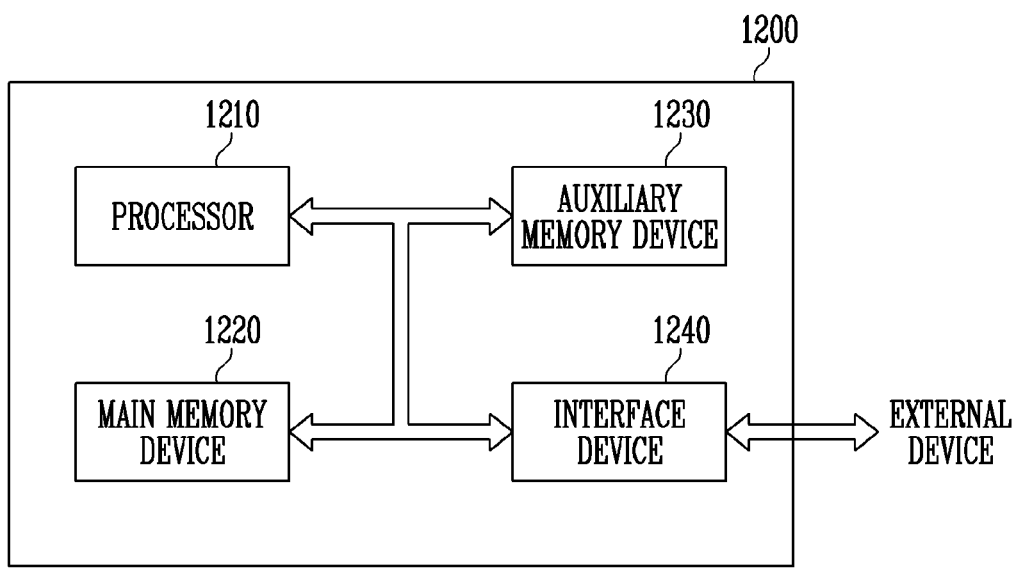
FIG. 10 is one example of a configuration diagram of a system implementing a memory device according to an embodiment of the present disclosure.

FIG. 10 is one example of a configuration diagram of a system implementing a memory device according to an embodiment of the present disclosure.

Referring to FIG. 10, a system 1200 is a device that processes data, and may perform input, process, output, communication, storage, and the like in order to perform a series of operations on data. The system 1200 may include a processor 1210, a main memory device 1220, an auxiliary memory device 1230, an interface device 1240, and the like. The system 1200 of the present embodiment may be various electronic systems operating using a processor, such as a computer, a server, a personal digital assistant (PDA), a portable computer, a web tablet, a wireless phone, a mobile phone, a smart phone, a digital music player, a portable multimedia player (PMP), a camera, a global positioning system (GPS), a video camera, a voice recorder, telematics, an audio visual system, a smart television, or the like.

The processor 1210 may control processes of analysis of an input command, an operation, comparison, and the like of data stored in the system 1200. The processor 1210 may be substantially the same as the microprocessor 1000 or the processor 1100 described above.

The main memory device 1220 is a memory space capable of moving, storing, and executing a program code or data from the auxiliary memory device 1230 when the program is executed, and may preserve a stored content even though power is cut off. The auxiliary memory device 1230 refers to a memory device for storing a program code or data. The auxiliary memory device 1230 is slower than the main memory device 1220 but may store a lot of data. The main memory device 1220 or the auxiliary memory device 1230 may include one or more embodiments of the electronic device described above. For example, the main memory device 1220 or the auxiliary memory device 1230 may include one or more memory elements. The memory element may include a first electrode, a second electrode, an insulating layer interposed between the first electrode and the second electrode and including an opening of an inclined sidewall, a variable resistance layer formed in the opening, including a first surface facing the first electrode and having a first area and a second surface facing the second electrode and having a second area different from the first area, and maintaining an amorphous state during a program operation, and a liner interposed between the variable resistance layer and the insulating layer and between the variable resistance layer and the first electrode. Therefore, reliability of the main memory device 1220 or the auxiliary memory device 1230 may be improved and a manufacturing process may be improved. As a result, an operation characteristic of the system 1200 may be improved.

Figure 11:
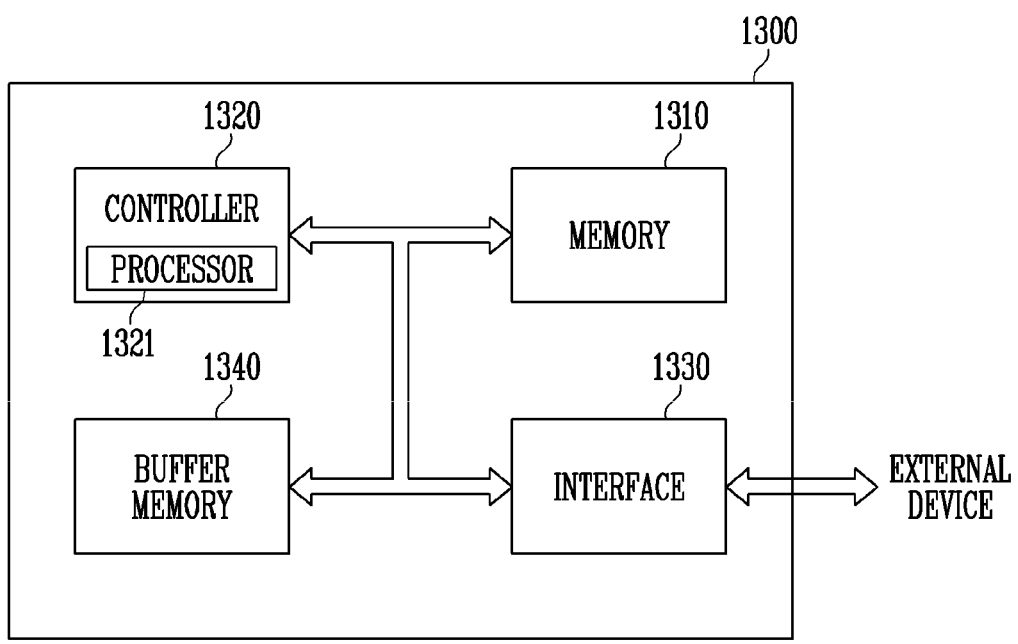
FIG. 11 is one example of a configuration diagram of a memory system implementing a memory device according to an embodiment of the present disclosure.

In addition, the main memory device 1220 or the auxiliary memory device 1230 may include a memory system 1300 as shown in FIG. 11 in addition to the semiconductor device of the embodiment described above or without the semiconductor device of the embodiment described above.

The interface device 1240 may be for exchanging an instruction, data, and the like between the system 1200 of the present embodiment and an external device. The interface device 1240 may be a keypad, a keyboard, a mouse, a speaker, a microphone, a display, various human interface devices (HIDs), a communication device, and the like. The communication device may be substantially the same as the communication module 1150 described above.

FIG. 11 is one example of a configuration diagram of a memory system implementing a memory device according to an embodiment of the present disclosure.

Referring to FIG. 11, the memory system 1300 may include a memory 1310 having a non-volatile characteristic as a configuration for storing data, a controller 1320 that controls the memory 1310, an interface 1330 for connection with an external device, and a buffer memory 1340 for temporarily storing data in order to efficiently transfer input/output of data between the interface 1330 and the memory 1310. The memory system 1300 may simply mean a memory for storing data, and further, may mean a data storage device for conserving the stored data over the long term. The memory system 1300 may be a disk type such as a hard disk drive (HDD), a compact disk read only memory (CDROM), a digital versatile disk (DVD), and a solid state disk (SSD), and a card type such as a universal serial bus (USB) memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded MMC (eMMC), and a compact flash (CF) card.

The memory 1310 or the buffer memory 1340 may include one or more embodiments of the semiconductor device described above. For example, the memory 1310 or the buffer memory 1340 may include one or more memory elements. The memory element may include a first electrode, a second electrode, an insulating layer interposed between the first electrode and the second electrode and including an opening of an inclined sidewall, a variable resistance layer formed in the opening, including a first surface facing the first electrode and having a first area and a second surface facing the second electrode and having a second area different from the first area, and maintaining an amorphous state during a program operation, and a liner interposed between the variable resistance layer and the insulating layer and between the variable resistance layer and the first electrode. Therefore, reliability of the memory 1310 or the buffer memory 1340 may be improved and a manufacturing process may be improved. As a result, an operation characteristic of the memory system 1300 may be improved.

The memory 1310 or the buffer memory 1340 may include various volatile or nonvolatile memories in addition to the semiconductor device of the embodiment described above or without the semiconductor device of the embodiment described above.

The controller 1320 may control exchange of data between the memory 1310 and the interface 1330. To this end, the controller 1320 may include a processor 1321 that performs an operation or the like for processing commands input through the interface 1330 from the outside of the memory system 1300.

The interface 1330 is for exchanging an instruction, data, and the like between the memory system 1300 and an external device. When the memory system 1300 is a card type or a disk type, the interface 1330 may be compatible with interfaces used in the card-type or disk-type devices, or may be compatible with interfaces used in devices similar to these devices. The interface 1330 may be compatible with one or more interfaces having different types.

What is claimed is:

1. A semiconductor device comprising:
   a first electrode;
   a second electrode;
   an insulating layer interposed between the first electrode and the second electrode and including an opening having an inclined sidewall;
   a variable resistance layer formed in the opening, the variable resistance layer including a first surface and a second surface, the first surface facing the first electrode and having a first area, the second surface facing the second electrode and having a second area different from the first area; and
   a liner interposed between the variable resistance layer and the insulating layer and between the variable resistance layer and the first electrode,
   wherein the variable resistance layer is programmed by performing a program operation to store logic states corresponding to a first amorphous state having a first resistance and a second amorphous state having a second resistance lower than the first resistance, wherein the insulating layer comprises:
a first insulating layer interposed between the first electrode and the second electrode; and
a second insulating layer interposed between the first insulating layer and the second electrode, and
wherein a slope of the inclined sidewall changes at a boundary between the first insulating layer and the second insulating layer.

2. The semiconductor device of claim 1, wherein the second area is greater than the first area.

3. The semiconductor device of claim 1, wherein the liner has a thickness of 1 to 20 Å between the variable resistance layer and the first electrode.

4. The semiconductor device of claim 1, wherein a current flows through the liner during the program operation.

5. The semiconductor device of claim 1, wherein the first insulating layer includes a first opening having a first sidewall with a first slope, and
wherein the second insulating layer includes a second opening having a second sidewall with a second slope different from the first slope.

6. The semiconductor device of claim 1, wherein a first portion of the liner adjacent to the first electrode has a first thickness and a second portion of the liner adjacent to the second electrode has a second thickness different from the first thickness.

7. The semiconductor device of claim 1, wherein a first portion of the liner adjacent to the first electrode has a first thickness and a second portion of the liner adjacent to the second electrode has a second thickness thicker than the first thickness.

8. A semiconductor device comprising:
a first electrode;
a second electrode;
a first insulating layer interposed between the first electrode and the second electrode and including a first opening having a first inclined sidewall inclined at a first angle with respect to a top surface of the first electrode;
a second insulating layer interposed between the first insulating layer and the second electrode and including a second opening having a second inclined sidewall inclined at a second angle with respect to the top surface of the first electrode, wherein the second angle is different from the first angle;
a variable resistance layer including a first portion formed in the first opening and a second portion formed in the second opening, the first portion having a first sidewall slope, the second portion having a second sidewall slope different from the first sidewall slope, the variable resistance layer maintaining an amorphous state during a program operation; and
a liner interposed between the variable resistance layer and the first and second insulating layers,
wherein a boundary between the first inclined sidewall and the second inclined sidewall is positioned at a boundary between the first insulating layer and the second insulating layer.

9. The semiconductor device of claim 8, wherein the liner extends between the variable resistance layer and the first electrode.

10. The semiconductor device of claim 9, wherein the liner has a thickness of 1 to 20 Å between the variable resistance layer and the first electrode.

11. The semiconductor device of claim 8, wherein the variable resistance layer includes a first surface facing the first electrode and having a first area, and a second surface facing the second electrode and having a second area different from the first area.

12. The semiconductor device of claim 11, wherein the second area is greater than the first area.

13. The semiconductor device of claim 8, wherein a current flows through the liner during the program operation.

14. The semiconductor device of claim 8, wherein a first portion of the liner adjacent to the first electrode has a first thickness and a second portion of the liner adjacent to the second electrode has a second thickness different from the first thickness.

15. The semiconductor device of claim 8, wherein a first portion of the liner adjacent to the first electrode has a first thickness and a second portion of the liner adjacent to the second electrode has a second thickness thicker than the first thickness.

16. The semiconductor device of claim 8, wherein the second electrode is directly on the variable resistance layer.

* * * * *